US007834892B2

(12) United States Patent
Haneda et al.

(10) Patent No.: US 7,834,892 B2
(45) **Date of Patent: *Nov. 16, 2010**

(54) MOBILE RADIO TERMINAL APPARATUS

(75) Inventors: Takushiro Haneda, Ome (JP); Kenichi Nakamura, Hino (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/389,133

(22) Filed: Feb. 19, 2009

(65) Prior Publication Data

US 2009/0153589 A1 Jun. 18, 2009

Related U.S. Application Data

(63) Continuation of application No. 11/241,304, filed on Sep. 30, 2005, now Pat. No. 7,564,467.

(30) Foreign Application Priority Data

May 10, 2005 (JP) ............................. 2005-137356

(51) Int. Cl.

| | |
|---|---|
| ***G09G 5/00*** | (2006.01) |
| ***G09G 5/22*** | (2006.01) |
| ***G06F 3/048*** | (2006.01) |
| ***G03F 3/00*** | (2006.01) |
| ***G04B 1/034*** | (2006.01) |

(52) U.S. Cl. ....................... 345/619; 345/551; 345/684; 345/156; 345/169; 455/95; 715/764; 715/784; 715/830; 715/864

(58) Field of Classification Search ....................... None
See application file for complete search history.

(56) References Cited

U.S. PATENT DOCUMENTS

| | | | | |
|---|---|---|---|---|
| 6,552,737 | B1 | 4/2003 | Tanaka et al. | |
| 7,029,812 | B2 | 4/2006 | Tokarski et al. | |
| 7,603,142 | B1 * | 10/2009 | Toebes et al. | 455/566 |
| 2001/0012025 | A1 * | 8/2001 | Wojaczynski et al. | 345/856 |
| 2002/0028697 | A1 | 3/2002 | Davies | |
| 2002/0129366 | A1 | 9/2002 | Schein et al. | |
| 2004/0080541 | A1 | 4/2004 | Saiga et al. | |
| 2004/0097195 | A1 | 5/2004 | Selleck | |
| 2004/0259617 | A1 | 12/2004 | Machida | |
| 2005/0040999 | A1 | 2/2005 | Numano | |
| 2005/0090977 | A1 | 4/2005 | Takizawa | |
| 2005/0165918 | A1 | 7/2005 | Watanabe et al. | |
| 2006/0142997 | A1 | 6/2006 | Jakobsen et al. | |
| 2006/0242595 | A1 * | 10/2006 | Kizumi | 715/786 |
| 2006/0288389 | A1 | 12/2006 | Deutscher et al. | |

(Continued)

FOREIGN PATENT DOCUMENTS

JP 10-210524 A 8/1998

(Continued)

*Primary Examiner*—Wesner Sajous
(74) *Attorney, Agent, or Firm*—Holtz, Holtz, Goodman & Chick, PC

(57) ABSTRACT

Control unit executes automatic scrolling display processing of allowing an explanation of an item corresponding to a focus, of listed items displayed in a list display area of display unit, to be automatically scrolled in a scrolling display area of the display unit. When the control unit repeats this processing at predetermined number of times N, the control unit stops the processing.

27 Claims, 3 Drawing Sheets

U.S. PATENT DOCUMENTS

| | | | |
|---|---|---|---|
| 2007/0200861 | A1 | 8/2007 | Kurokawa et al. |
| 2007/0206831 | A1 | 9/2007 | Matsuno et al. |
| 2007/0209018 | A1* | 9/2007 | Lindemann ................. 715/784 |
| 2007/0292812 | A1 | 12/2007 | Furner et al. |
| 2008/0110067 | A1 | 5/2008 | Smith et al. |
| 2010/0026629 | A1* | 2/2010 | Toebes et al. ............... 345/168 |

FOREIGN PATENT DOCUMENTS

| | | | |
|---|---|---|---|
| JP | 2001-060135 | A | 3/2001 |
| JP | 2002-099484 | A | 4/2002 |
| JP | 2002-111848 | A | 4/2002 |
| JP | 2002-185599 | A | 6/2002 |
| JP | 2002-290516 | A | 10/2002 |
| JP | 2004-110242 | A | 4/2004 |
| JP | 2004-242278 | A | 8/2004 |

* cited by examiner

MOBILE RADIO TERMINAL APPARATUS

CROSS-REFERENCE TO RELATED APPLICATIONS

The present application is a Continuation Application of U.S. application Ser. No. 11/241,304 filed Sep. 30, 2005, now U.S. Pat. No. 7,564,467, which is based upon and claims the benefit of priority from prior Japanese Patent Application No. 2005-137356, filed May 10, 2005, the entire contents of which are incorporated herein by reference.

BACKGROUND OF THE INVENTION

1. Field of the Invention

This invention relates to a mobile radio terminal apparatus having a function of displaying at least character information.

2. Description of the Related Art

In a conventional mobile radio terminal apparatus, for example, a display image is split into two display areas, a list of plural items is displayed in one of the display areas and an item of the list where a focus is placed is explained in the other display area. If the explanation in the other display area includes long sentences, the explanation is automatically scrolled and user's labor is thereby saved (for example, Jpn. Pat. Appln. KOKAI Publication No. 2004-242278).

BRIEF SUMMARY OF THE INVENTION

The present invention has been accomplished to solve the above-described problems. The object of the present invention is to provide a mobile radio terminal apparatus capable of reducing power consumption for automatic scrolling display.

To achieve the object, an aspect of the present invention is a mobile radio terminal apparatus capable of conducting communications with a radio base station connected to a network. The apparatus comprises display unit configured to display at least character information, memory unit configured to store character data, and display control unit configured to control the display unit to repeat at a preset number of times a scrolling processing of allowing character information based on the character data stored by the memory unit to be scrolled on the display unit.

According to the present invention, a mobile radio terminal apparatus capable of reducing power consumption for automatic scrolling display can be provided.

Additional objects and advantages of the invention will be set forth in the description which follows, and in part will be obvious from the description, or may be learned by practice of the invention. The objects and advantages of the invention may be realized and obtained by unit of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

An embodiment of the present invention will be explained below with reference to the accompanying drawings.

Figure 1:
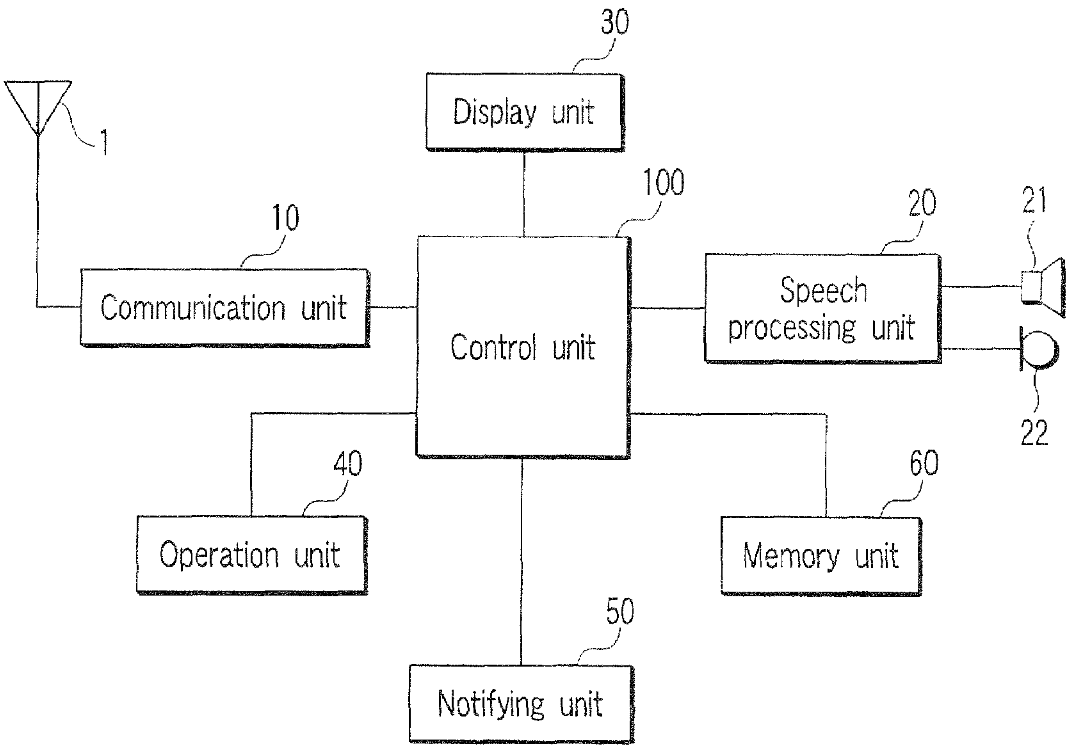
FIG. 1 shows a circuit block diagram of a mobile radio terminal apparatus according to an embodiment of the present invention.

FIG. 1 shows a mobile radio terminal apparatus according to an embodiment of the present invention. The mobile radio terminal apparatus comprises an antenna 1, a communications unit 10, a speech processing unit 20, a display unit 30, an operation unit 40, a notifying unit 50, a memory unit 60 and a control unit 100.

The antenna 1 receives a radio signal transmitted from a radio base station (not shown) connected to a network and transmits a radio signal of the mobile radio terminal apparatus to the radio base station.

The communication unit 10 carries out radio communications with the radio base station via the antenna 1 and carries out communications with a communication party via the radio base station and the network. More specifically, the communication unit 10 obtains encoded speech data transmitted from the communication party by downconverting and demodulating the radio signal received by the antenna 1, and outputs the encoded speech data to the speech processing unit 20 via the control unit 100. In addition, the communication unit 10 modulates a baseband signal with encoded speech data supplied from the speech processing unit 20 via the control unit 100, generates a radio signal by upconverting the baseband signal, and transmits the radio signal to the radio base station via the antenna 1.

The speech processing unit 20 reproduces a speech signal by decoding the encoded speech data demodulated by the communication unit 10, and outputs the speech signal from a built-in speaker 21. Conversation speech transmitted from the communication party is thereby transmitted to the user. In addition, the speech processing unit 20 generates encoded speech data by encoding a speech signal input from a built-in microphone 22 and supplies the encoded speech data to the communication unit 10 via the control unit 100.

Figure 2:
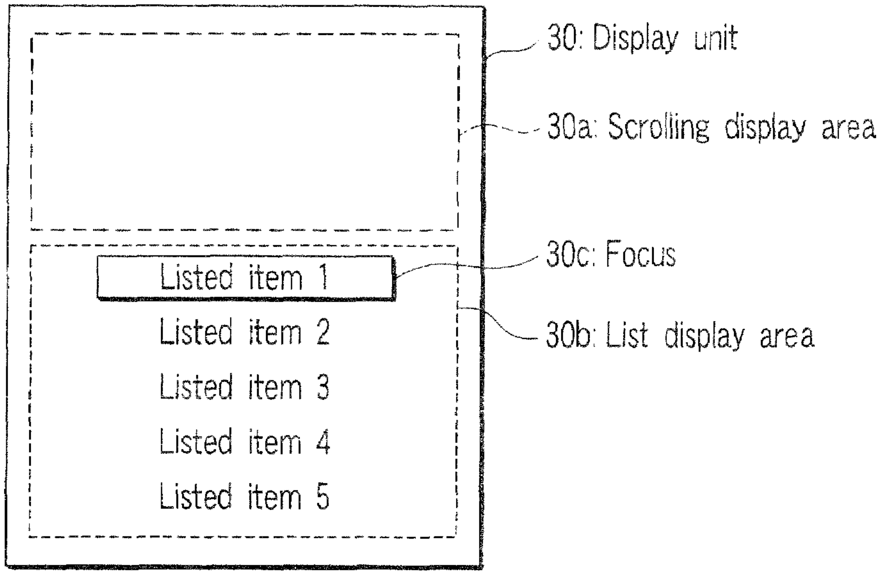
FIG. 2 shows an illustration of information displayed on a display unit of the mobile radio terminal apparatus shown in FIG. 1.

The display unit 30 is a display device employing a LCD (Liquid Crystal Display) or the like which shows various kinds of visual information such as texts, images and the like to the user. FIG. 2 shows an example of contents displayed on the display unit 30. In FIG. 2, a display area of the display unit 30 is split into a scrolling display area 30*a* and a list display area 30*b*.

In the list display area 30*b*, received call history of electronic mails, setting items of the mobile radio terminal apparatus, and the like are listed. In the display area, a focus 30*c* to select any one of the listed items is also displayed.

In the scrolling display area 30*a*, an explanation of the item corresponding to the focus 30*c* is displayed under control of the control unit 100 to be described later. As an example, a two-line display area is described below.

The operation unit 40 comprises a plurality of key switches and the like to accept a user's request. The notifying unit 50 notifies the user of reception of an incoming call by sounds. The memory unit 60 stores control programs and control data of the control unit 100, telephone book data corresponding to telephone numbers, names and image data such as face pictures, data of transmitted and received mails, data concerning the settings of the mobile radio terminal apparatus, and the like.

The control unit 30 controls each of the units in the mobile radio terminal apparatus. For example, the control unit 100 comprises an incoming call control function of controlling the display unit 30 and notifying unit 50 to notify occurrence of the incoming call in a case where the communication unit 10 receives an incoming call signal from the radio base station, and of urging the communication unit 10 to transmit a signal responding to the incoming call and establishing a speech communications link, by user's response operation executed with the operation unit 40.

In addition, the control unit 100 comprises an outgoing call control function of transmitting an outgoing call to a telephone number designated by the user by controlling the communication unit 10, in response to the user's request for outgoing call made with the operation unit 40, and a communications control function of establishing a speech communications link in accordance with the outgoing call. Moreover, the control unit 100 comprises a control function of reading text data stored in the memory unit 60 and urging the display unit 30 to display the text data, in response to the user's request made with the operation unit 40.

Next, operations of the mobile radio terminal apparatus having the above-explained structure are described. In the following descriptions, control of displaying the text data stored in the memory unit 60 on the display unit 30 is explained. Explanations on steps of establishing a communications link with a radio base station, control to implement speech communications, registration, invocation and editing of telephone book data, and the Like are omitted.

Figure 3:
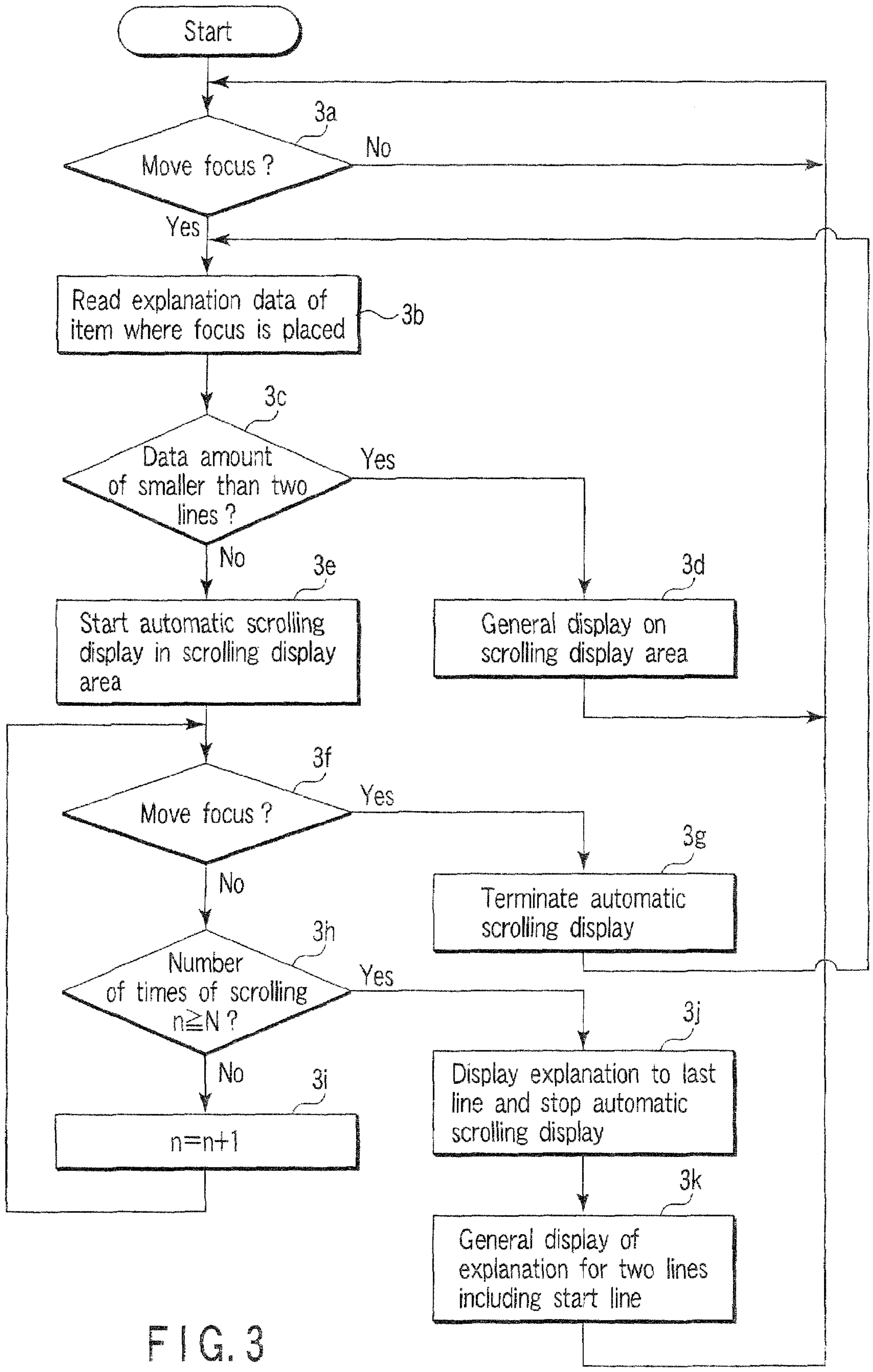
FIG. 3 shows a flowchart of display control of the display unit of the mobile radio terminal apparatus shown in FIG. 1.

FIG. 3 shows a flowchart of the display control. The processing of the flowchart is started when a plurality of listed items are displayed on the list display area 30*b* as shown in FIG. 2 at a request made by the user with the operation unit 40. A control program to implement the control shown in the flowchart is stored in the memory unit 60.

In accordance with the start, the control unit 100 reads the information items designated by the user out of the memory unit 60 and lists the items in the list display area 30*b*. The control unit 100 displays the focus 30*c* in association with the top item, of the items displayed in the list display area 30*b*.

First, in step 3*a*, the control unit 100 determines whether or not the user has made a request for movement of the focus 30*c* with the operation unit 40. If the control unit 100 determines that the user has made the request, the control unit 100 shifts to step 3*b*. If the control unit 100 determines that the user has not made the request, the control unit 100 returns to step 3*a* and determines again whether or not the user has made the request. Immediately after the processing is started, the control unit 100 determines that the user has made the request and shifts to step 3*b*.

In step 3*b*, the control unit 100 moves the focus 30*c* to a position associated with the request which the user made with the operation unit 40. In addition, the control unit 100 reads explanation data associated with the item which is also associated with the focus 30*c*, out of the memory unit 60, and shifts to step 3*c*.

In step 3*c*, the control unit 100 determines whether or not the explanation data read in step 3*b* has data amount equal to or smaller than two lines of explanation. If the explanation data read in step 3*b* has data amount equal to or smaller than two lines of explanation, the control unit 100 shifts to step 3*d*. If the explanation data read in step 3*b* has data amount equal to or greater than three lines of explanation, the control unit 100 shifts to step 3*e*.

In step 3*d*, the control unit 100 displays the explanation data read in step 3*b*, in the scrolling display area 30*a*, and shifts to step 3*a*. The explanation data is displayed in a general scheme without scrolling.

In step 3*e*, the control unit 100 starts automatic scrolling display processing of allowing the explanation data read in step 3*b* to be scrolled down from the start line, in the scrolling display area 30*a*. The control unit 100 shifts to step 3*f*.

Figure 4:
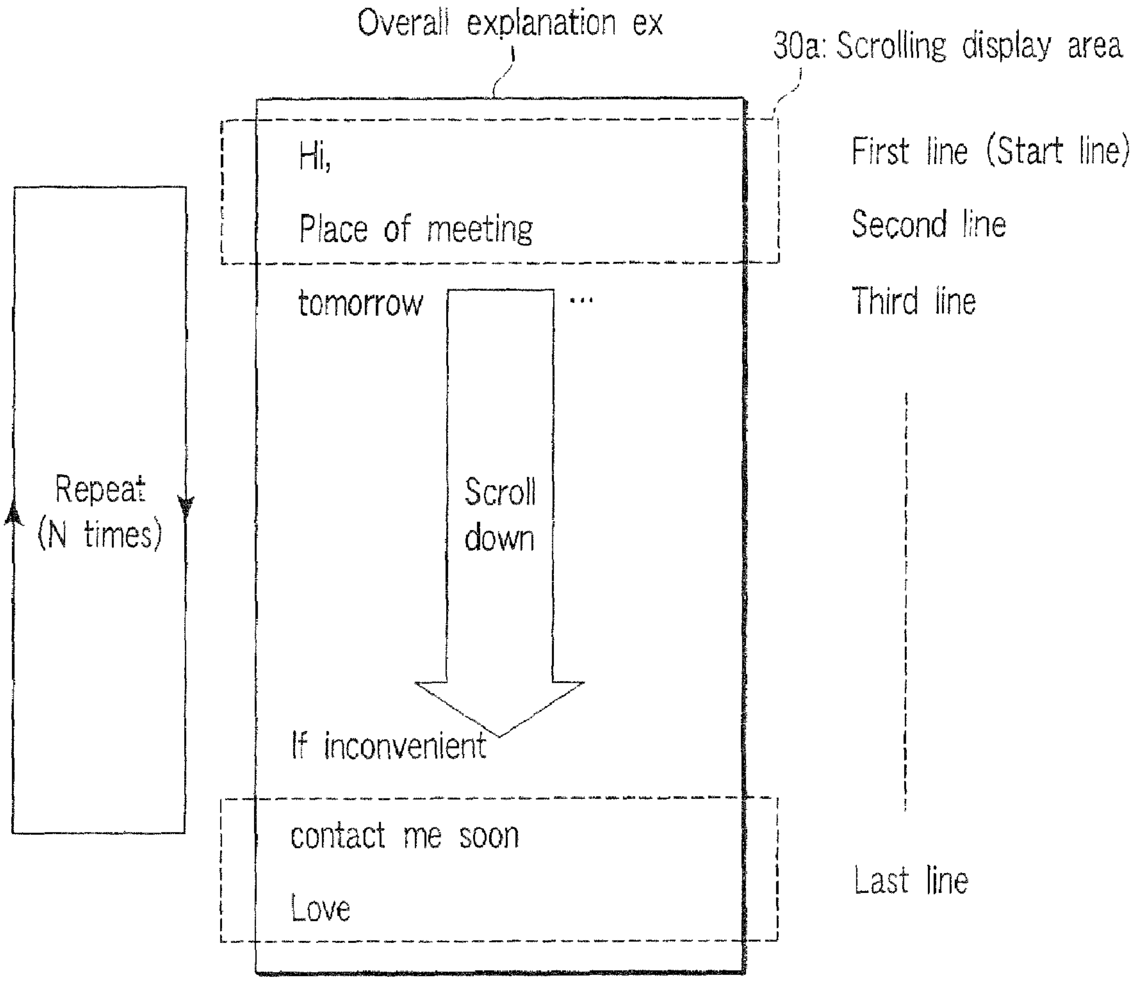
FIG. 4 shows an image of automatic scrolling display executed by the processing of FIG. 3.

FIG. 4 shows an image of the automatic scrolling display processing. The automatic scrolling display processing scrolls the scrolling display area 30*a* on overall explanation ex representing an entire body of the explanation data to display the contents for two lines from the start line.

In step 3*f*, the control unit 100 determines whether or not the user has made a request for movement of the focus 30*c* with the operation unit 40. If the control unit 100 determines that the user has made the request, the control unit 100 shifts to step 3*g*. If the control unit 100 determines that the user has not made the request, the control unit 100 returns to step 3*h*.

In step 3*g*, the control unit 100 stops the automatic scrolling display processing started in step 3*e* and shifts to step 3*b*.

In step 3*h*, the control unit 100 determines whether or not number of times n of scrolling is equal to or greater than a preset threshold value N. If the number of times n of scrolling is equal to or greater than the preset threshold value N, the control unit 100 shifts to step 3*j*. If the number of times n of scrolling is smaller than the preset threshold value N, the control unit 100 continues the automatic scrolling display processing and shifts to step 3*i*.

In step 3*i*, the control unit 100 adds "1" to the number of times n of scrolling, and shifts to step 3*f* while continuing the automatic scrolling display processing.

In step 3*j*, the control unit 100 continues the automatic scrolling display processing until two lines of the explanation including the last line are displayed in the scrolling display area 30*a*. When two lines of the explanation including the last line are displayed, the control unit 100 stops the automatic scrolling display processing and shifts to step 3*k*.

In step 3*k*, the control unit 100 displays two lines of the explanation, of the explanation data read in step 3*b*, in the general scheme, in the scrolling display area 30*a*. The control unit 100 resets the number of times n of scrolling to "0" and shifts to step 3*a*.

When the automatic scrolling display processing has been stopped in step 3*k*, the control unit 100 does not need to display the explanation data of two lines including the start line, in the general scheme, in the scrolling display area 30*a*. The control unit 100 may display an arbitrary portion of the explanation data read in step 3*b* or may newly read data of characters and symbols by simplifying the explanation into two lines and display the data of characters and symbols instead of the explanation data.

In the mobile radio terminal apparatus having the above-described structure, the automatic scrolling display processing of allowing the explanation of the item associated with the focus 30*c*, of the listed items displayed in the list display area 30*b*, to be automatically scrolled down in the scrolling display area 30*a*, is executed. When this processing is repeated at predetermined number of times N, the processing is stopped.

Therefore, since the mobile radio terminal apparatus can prevent the display processing from unlimitedly repeated due to the automatic scrolling, waste of battery power consumption can be prevented.

The present invention is not limited to the embodiment described above but the constituent elements of the invention can be modified in various manners without departing from the spirit and scope of the invention. Various aspects of the invention can also be extracted from any appropriate combination of a plurality of constituent elements disclosed in the embodiment. Some constituent elements may be deleted in all of the constituent elements disclosed in the embodiment.

For example, when the number of times n of repeated display of the overall explanation ex becomes the predetermined number of times N, the automatic scrolling display processing is stopped. Instead of this, however, she control unit 100 may measure the start time of the automatic scrolling display processing and may stop the automatic scrolling display processing when a predetermined time has elapsed from the start time.

When the number of times n of repeated display of the overall explanation ex becomes the predetermined number of times N, the processing is stopped and the explanation for two lines is displayed from the start line, in the general scheme, in step 3*k*. In addition to this, for example, reception of the request which is made by the user with the operation unit 40 may be monitored in step 3*k* and then the automatic scrolling display processing may be restarted in response to the user's request, in step 3*e*. The restarted automatic scrolling display processing may not be repeated at N times, but one time or more than N times.

Furthermore, a backlight is provided at the display unit 30 and is turned on/off under control of the control unit 100. In general, the control unit 100 turns off the backlight when a predetermined time has elapsed after the user executes the operation with the operation unit 40.

When the automatic scrolling display processing is executed, the backlight is turned on. The backlight is turned off simultaneously with the termination of the automatic scrolling display processing. By controlling the backlight in this manner, power consumption for the backlight can be reduced.

Moreover, the automatic scrolling display processing is repeated at N times in the above-described embodiment. The number of times of repetition may be preset by the user with the operation unit 40. If the repetition is controlled by the time, the time may be preset by the user with the operation unit 40.

Needless to say, the present invention can also be variously modified within a scope which does not depart from the gist of the present invention.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A communication terminal comprising:

a display unit which displays at least character information;

a memory unit which stores character data;

an operation unit which accepts a request; and a display control unit which controls the display unit to display a list including a plurality of list items on the display unit, display part of character information corresponding to one of the list items selected via the operation unit, and automatically scroll the character information corresponding to the selected list item so that all of the character information is displayed sequentially on the display unit.

2. The communication terminal according to claim 1, wherein the display control unit controls the display unit to scroll through the character information a preset number of times.

3. The communication terminal according to claim 2, wherein the preset number of times is set via the operation unit.

4. The communication terminal according to claim 1, wherein the display control unit controls the display unit to restart scrolling of the character information in response to a request accepted by the operation unit.

5. The communication terminal according to claim 1, wherein the display control unit turns on and off a lighting unit in association with the scrolling of the character information.

6. The communication terminal according to claim 1, wherein the display control unit controls the display unit to scroll the character information for a predetermined period of time.

7. The communication terminal according to claim 6, wherein the predetermined period of time is set via the operation unit.

8. A mobile radio terminal apparatus which communicates with a radio base station connected to a network, comprising:

a display unit configured to display at least character information;

a memory unit configured to store character data;

an operation unit configured to accept a request from a user; and a display control unit configured to control the display unit to display a list of a plurality of character data stored in the memory unit, on a first display area of the display unit, and to perform an automatic scrolling operation of automatically repeating a preset number of times an operation of automatically scrolling through an entire body of character information corresponding to character data in the list designated by the request accepted by the operation unit, on a second display area of the display unit which is different from the first display area.

9. The apparatus according to claim 8, wherein the preset number of times is set by the user with the operation unit.

10. The apparatus according to claim 8, wherein after repeating the operation of scrolling the preset number of times, the display control unit controls the display unit to display the character information in a range from a leading portion to a preset portion of the character information.

11. The apparatus according to claim 8, wherein the display control unit controls the display unit to display character information corresponding to character data in the list designated by the request accepted by the operation unit without being scrolled when the character information fits within the second display area of the display unit.

12. The apparatus according to claim 8, wherein the display control unit controls the display unit to restart the automatic scrolling operation in response to the request accepted by the operation unit.

13. The apparatus according to claim 8, further comprising a lighting unit configured to light the display unit, wherein the display control unit controls turning on/off the lighting unit in association with the automatic scrolling operation.

14. A mobile radio terminal apparatus which communicates with a radio base station connected to a network, comprising:

a display unit configured to display at least character information;

a memory unit configured to store character data;

an operation unit configured to accept a request from a user; and a display control unit configured to control the display unit to display a list of a plurality of character data stored in the memory unit, on a first display area of the display unit, and to perform an automatic scrolling operation of automatically repeating for a preset period of time an operation of automatically scrolling through an entire body of character information corresponding to character data in the list designated by the request accepted by the operation unit, on a second display area of the display unit which is different from the first display area.

15. The apparatus according to claim 14, wherein the preset period of time is set by the user with the operation unit.

16. The apparatus according to claim 14, wherein after repeating the operation of scrolling for the preset period of time, the display control unit controls the display unit to display the character information in a range from a leading portion to a preset portion of the character information.

17. The apparatus according to claim 14, wherein the display control unit controls the display unit to display character information corresponding to character data in the list designated by the request accepted by the operation unit without being scrolled when the character information fits within the second display area of the display unit.

18. The apparatus according to claim 14, wherein the display control unit controls the display unit to restart the automatic scrolling operation in response to the request accepted by the operation unit.

19. The apparatus according to claim 14, further comprising lighting unit configured to light the display unit, wherein the display control unit controls turning on/off the lighting unit in association with the automatic scrolling operation.

20. A mobile radio terminal apparatus capable of conducting communications with a radio base station connected to a network, comprising:

display means for displaying at least character information;

memory means for storing character data;

operation means for receiving input from a user; and display control means for (i) controlling the display means to display a list of a plurality of character data stored in the memory means, on a first display area of the display means, and (ii) when the user shifts a focus from one character data in the displayed list to another character data in the displayed list via the operation means, controlling the display means to perform an automatic scrolling operation of automatically repeating a preset number of times an operation of automatically scrolling through an entire body of character information corresponding to said another character data on a second display area of the display means which is different from the first display area.

21. The apparatus according to claim 20, wherein the preset number of times is set by the user with the operation means.

22. The apparatus according to claim 20, wherein after repeating the operation of scrolling the preset number of times, the display control means controls the display means to display the character information in a range from a leading portion to a preset portion of the character information.

23. The apparatus according to claim 20, wherein the display control means controls the display means to display character information corresponding to character data in the list designated by the request accepted by the operation means without being scrolled when the character information fits within the second display area of the display means.

24. The apparatus according to claim 20, wherein the display control means controls the display means to restart the automatic scrolling operation in response to a request received via the operation means.

25. The apparatus according to claim 20, further comprising lighting means configured to light the display means, wherein the display control means controls turning on/off the lighting means in association with the automatic scrolling operation.

26. A mobile radio terminal apparatus which communicates with a radio base station connected to a network, comprising:

a display unit configured to display at least character information;

a memory unit configured to store character data;

an operation unit configured to accept a request from a user; and a display control unit configured to control the display unit to display a list of a plurality of character data stored in the memory unit, on a first display area of the display unit, and to perform an automatic scrolling operation of automatically repeating a preset number of times an operation of automatically scrolling through character information corresponding to character data in the list designated by the request accepted by the operation unit, on a second display area of the display unit which is different from the first display area;

wherein the display control unit controls the display unit to display character information corresponding to character data in the list designated by the request accepted by the operation unit without being scrolled when the character information fits within the second display area of the display unit.

27. A mobile radio terminal apparatus which communicates with a radio base station connected to a network, comprising:

a display unit configured to display at least character information;

a memory unit configured to store character data;

an operation unit configured to accept a request from a user; and a display control unit configured to control the display unit to display a list of a plurality of character data stored in the memory unit, on a first display area of the display unit, and to perform an automatic scrolling operation of automatically repeating for a preset period of time an operation of automatically scrolling through character information corresponding to character data in the list designated by the request accepted by the operation unit, on a second display area of the display unit which is different from the first display area;

wherein the display control unit controls the display unit to display character information corresponding to character data in the list designated by the request accepted by the operation unit without being scrolled when the character information fits within the second display area of the display unit.

* * * * *